US008592741B2

(12) United States Patent
Halahmi et al.

(10) Patent No.: US 8,592,741 B2
(45) Date of Patent: Nov. 26, 2013

(54) IMAGE SENSOR CELL FOR NIGHT VISION

(75) Inventors: Erez Halahmi, Bazra (IL); Gilad Diamant, Haifa (IL); Tamar Ravon, Ramat Aviv (IL)

(73) Assignee: NovaTrans Group SA, Vaumarcus (CH)

( * ) Notice: Subject to any disclaimer, the term of this patent is extended or adjusted under 35 U.S.C. 154(b) by 544 days.

(21) Appl. No.: 12/678,869

(22) PCT Filed: Sep. 24, 2008

(86) PCT No.: PCT/IL2008/001287
§ 371 (c)(1),
(2), (4) Date: Sep. 12, 2010

(87) PCT Pub. No.: WO2009/040812
PCT Pub. Date: Apr. 2, 2009

(65) Prior Publication Data

US 2011/0042550 A1 Feb. 24, 2011

Related U.S. Application Data

(60) Provisional application No. 60/960,266, filed on Sep. 24, 2007.

(51) Int. Cl.
*H01L 27/148* (2006.01)

(52) U.S. Cl.
USPC .............. 250/214 VT; 250/207; 313/103 CM

(58) Field of Classification Search
USPC .................... 250/214 VT, 207; 313/528, 534, 313/103 CM, 105 CM
See application file for complete search history.

(56) References Cited

U.S. PATENT DOCUMENTS

| | | | | |
|---|---|---|---|---|
| 6,157,021 | A | 12/2000 | Fish | |
| 6,828,542 | B2 * | 12/2004 | Ye et al. | 250/208.1 |
| 7,368,699 | B2 * | 5/2008 | Shamir et al. | 250/214 VT |
| 7,619,199 | B2 * | 11/2009 | Hirai et al. | 250/214 VT |
| 2005/0167575 | A1 | 8/2005 | Benz et al. | |

FOREIGN PATENT DOCUMENTS

| | | |
|---|---|---|
| FR | 2895146 | 6/2007 |
| WO | 99/05695 A1 | 2/1999 |
| WO | 2006/077595 A2 | 7/2006 |

OTHER PUBLICATIONS

International Search Report and Written Opinion dated Jan. 26, 2009 in corresponding International Application No. PCT/IL2008/001287.

* cited by examiner

*Primary Examiner* — Tony Ko
(74) *Attorney, Agent, or Firm* — The Law Office of Michael E. Kondoudis

(57) ABSTRACT

An image sensor cell (100) is presented for use in an imaging device, for example of a night vision type. The image sensor cell (100) comprises an electrodes' assembly and a control unit (118). The electrodes' assembly is configured and operable to receive an input light signal and produce a corresponding electrical signal. The electrodes' assembly comprises a photocathode (112) having an active region capable of emitting electrons in response to incident light; and at least one electrode (114, 116) in a path of electrons emitted from the photocathode (112). The control unit (118) is configured and operable for controlling an electric field profile in said path so as to selectively cause the electrons' capture on said at least one electrode (114,116) resulting in accumulation of charge on said at least one electrode (114,116) corresponding to the input electromagnetic signal indicative of an acquired image, thereby enabling direct reading of the accumulated charge. The image sensor cell (100) thus provides for direct conversion of a light signal into an electric signal indicative thereof.

21 Claims, 11 Drawing Sheets

(General Art)

IMAGE SENSOR CELL FOR NIGHT VISION

FIELD OF THE INVENTION

This invention is generally in the field of image sensors, and relates to an image sensor cell which may be used in night vision devices.

BACKGROUND OF THE INVENTION

Night vision devices gather existing ambient light (starlight, moonlight or infra-red light) through a collection lens unit. The collected light passes through an image intensifier typically based on a photocathode tube. In such photocathode tube, an input light signal causes emission of electrons from the photocathode which propagate to a luminescent screen producing a light output. Some types of image intensifiers utilize a micro-channel plate (MCP) which works as an electron amplifier and is placed directly behind the photocathode. The MCP consists of a large number of short parallel glass tubes. When the electrons pass through these short tubes, thousands more electrons are released.

FIG. 1 illustrates schematically the conventional approach for night vision devices. As shown, an imager, such as CMOS or CCD, is equipped with an image intensifier, e.g. of the kind utilizing an MCP, where the photocathode and luminescent screen structure of the image intensifier are kept at high potential difference (i.e. high operating voltage). Thus, the image intensifier provides an intensified light signal input to an electronic device including the CMOS/CCD imager. There, the light signal is converted into an electrical signal and transmitted to the CMOS/CCD read out circuit.

GENERAL DESCRIPTION OF THE INVENTION

The present invention provides a novel approach for image sensors, in particular suitable for night vision devices. According to this approach, an electrical signal, indicative of an input light signal, is directly coupled to an electronic read out circuit, such as CMOS or CCD. More specifically, an image pixel is constituted by a sensor cell comprising an electrodes' assembly capable of receiving an input light signal and producing a corresponding electrical signal based on the principles of photoemission (or voltage enhanced photoemission), where the electrical signal is in the form of a charge/potential reaching/accumulated on one of the electrodes. This electrodes' assembly comprises a photocathode and one or more electrodes defining a cavity for electrons' propagation path and operable for attracting electrons flowing in said path. The attracting electrode may or may not be a floating electrode (i.e. electrode which is not connected to any voltage supplier and/or reader), and either serves for accumulating thereon or for allowing accumulation on another electrode of charge/potential indicative of the input light signal, i.e. image data. To this end, an electric field profile in said path is appropriately controlled to selectively cause the electrons' capture on the (floating) electrode resulting in accumulation of charge/potential.

Generally, the image sensor cell of the present invention may include only photocathode and an anode and/or gate unit which may be constituted by electrode(s) of a conventional read out circuit, appropriately operated according to the principles of the invention for causing the charge/potential accumulation and reading.

Preferably, the electrodes' assembly includes a photocathode, a floating gate and an anode, and is operable in so-called "image capture" mode and "image read" mode.

Thus, according to one broad aspect of the invention, there is provided an image sensor cell comprising:

an electrodes' assembly configured and operable to receive an input light signal and produce a corresponding electrical signal, the electrodes' assembly comprising: a photocathode having an active region capable of emitting electrons in response to incident light; and at least one electrode in a path of electrons emitted from the photocathode; and a control unit configured and operable for controlling an electric field profile in said path so as to selectively cause the electrons' capture on said at least one electrode resulting in accumulation of charge on said at least one electrode corresponding to the input electromagnetic signal indicative of an acquired to image, thereby enabling direct reading of the accumulated charge;

the image sensor cell thereby providing for direct conversion of a light signal into an electric signal indicative thereof.

In some embodiments, said at least one electrode is anode from which an electric current corresponding to said accumulated charge is read out.

In some other embodiments, said at least one electrode is a floating electrode, in which case the electrodes' assembly comprises at least one anode spaced apart from said floating electrode and serving for measuring therein an electric current corresponding to the charge accumulated on the floating electrode.

In the latter case, an electrons' flux is created in said path towards the anode to enable reading the accumulated charge. The control unit is thus configured and operable to cause creation of the electrons' flux and to concurrently modify the electric field profile allowing the electrons' flux passing through the charged floating electrode, resulting in an electric current on the anode indicative of said accumulated charge.

An electrons' flux generating unit may be configured and operable to create the electrons' flux by field-, photo- or thermo-emission effect. This may be implemented using an illuminator for illuminating said photocathode.

Thus, in some embodiments of the invention, the electrodes' assembly is sequentially operable in first and second modes for respectively acquiring an image data in the form of the accumulated charge (capture stage) and reading said charge (reading stage). The first and second modes differ from one another in the electric field profile in said path.

The first mode can be effected by providing the electric field of a certain value in said path, and the second mode—by providing a varying electric field in said path. As for the image erasing mode, this consists of at least partially discharging the floating electrode, preferably to a certain charge value (negative relatively to anode) to improve dark pixel identification.

The floating electrode (gate) is typically a grid formed by an array of spaced-apart electrically conductive elements. The latter may be constituted by a layer containing a plurality of particles (nanoparticles). The particles may be linked to a surface of the anode. The particles in the layer may be of different sizes.

Said at least one electrode of the image sensor cell of the present invention may be a part of a Complementary metal-oxide-semiconductor (CMOS) integrated circuit; or a part of a Charge-Coupled Device (CCD). Accordingly, the control unit may be at least partially integrated in said CMOS/CCD.

BRIEF DESCRIPTION OF THE DRAWINGS

In order to understand the invention and to see how it may be carried out in practice, embodiments will now be described, by way of non-limiting example only, with reference to the accompanying drawings, in which.

DETAILED DESCRIPTION OF EMBODIMENTS

Figure 1:
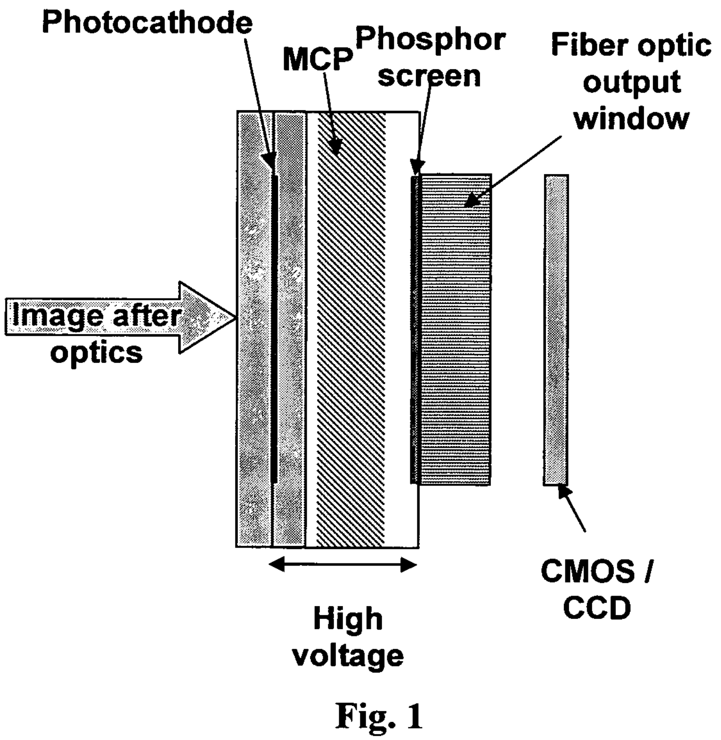
FIG. 1 is a schematic illustration of a night vision device based on the conventional approach.
Figure 2:
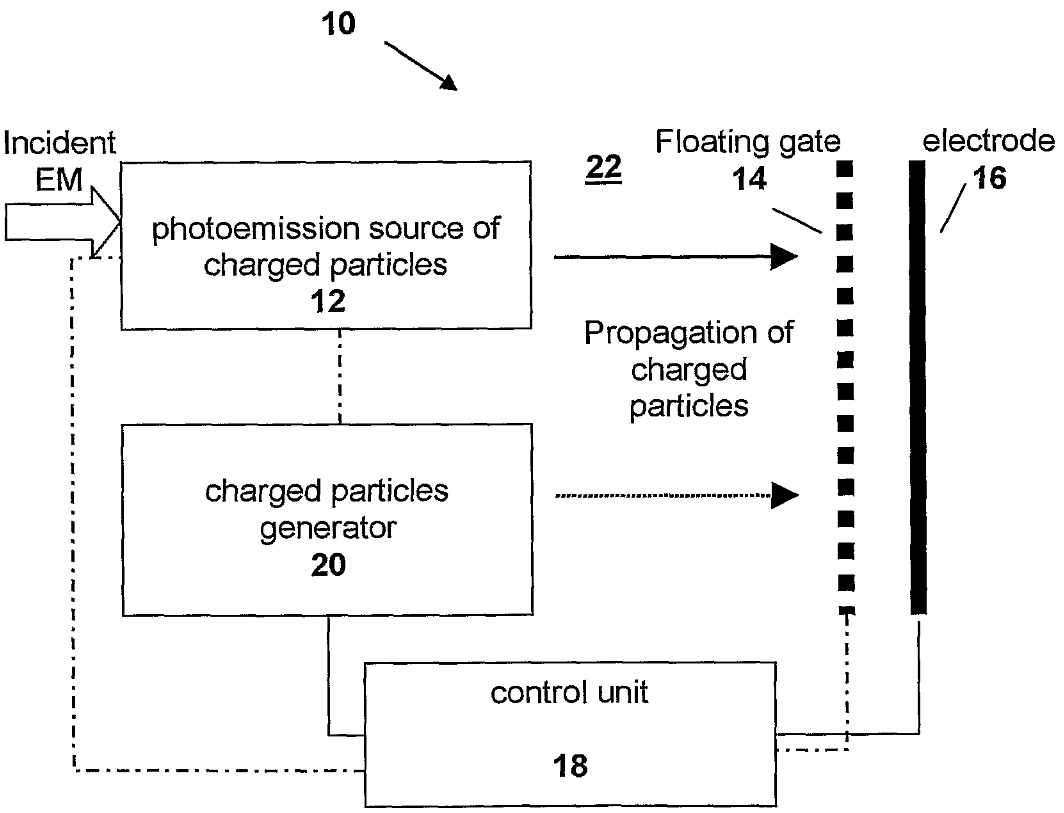
FIG. 2 is a block diagram of a sensor cell device of the present invention.

Referring to FIG. 2, there is illustrated, by way of a block diagram, a sensor cell unit 10 according to an embodiment of the present invention. Such sensor cell unit may be used in an image sensor device, presenting a pixel unit of a pixel matrix. The sensor cell 10 utilizes the principles of photoemission (or voltage enhanced photo-emission) for directly converting an input light signal, to which the cell is exposed, into an electrical output which may be executed at or directly coupled to a suitable electronic read out circuit, such as CMOS or CCD. The device allows for measuring a wide range of light intensities and may be adapted for use in a night vision sensor for measuring/imaging light of low intensity.

Sensor cell 10 includes photoemission-based source of charged particles 12 associated with electrodes' arrangement. In particular, the invention utilizes electrons' free space propagation in a cavity 22 between a photocathode and an additional electrode, and is therefore described below with respect to this application. The cavity is typically a low-pressure or vacuum medium, or any other media provided distances between the electrodes are adjusted in accordance with the mean free path propagation of charged particles (electrons) in said media.

Thus, sensor cell 10 includes an electrodes' assembly formed by an electron source (one or more photocathodes) 12, and one or more electrodes operating for attracting electrons propagating through the cavity 22. Generally, the one or more electrodes may be constituted by a single electrode, floating or not. In the case that at least one of the attracting electrodes is a floating electrode, an electrical output indicative of the light input can be acquired in the form of a charge accumulated on the floating electrode. This charge can then be read out either directly from said electrode or as a corresponding electrical current on an additional electrode (anode) which is correlated with the charge on the electrode.

In the specific but not limiting example of FIG. 2, the electrodes' assembly includes a floating gate (generally at least one) 14, and at least one anode 16. Also, in this example, where charged accumulated on floating gate 14 is read by a further induced electric current, the sensor cell 10 is associated with charged particles' (electrons') flux generating unit 20. In the present example, electrons' flux generating unit 20 is associated with photocathode 12 and is configured as an electrons' extractor (typically illuminator) to extract electrons from photocathode by photoemission effect. It should, however, be understood that unit 20 in the form of illuminator may be associated with another photocathode, as well as unit 20 may include an electron source of any type not necessarily utilizing an effect of photoemission, or it may be configured to extract electrons from said photocathode by means other than photoemission, e.g. thermo- or field-emission.

The sensor cell further includes a control unit 18 connected to one or more electrodes from the electrodes' assembly (to anode 16 and photocathode 12) and adapted for controlling an electric field (or electric field profile) in the electrons' propagation path, e.g. by controlling the voltage on anode 16. Also, the control unit is adapted for measuring electric current induced on anode 16 by electrons collected thereon. As shown in the example of FIG. 2, control unit 18 may also be connected to the electrons' flux generating unit 20 for controlling its operation and thus for example controlling initiation of the electrons' flux from photocathode 12.

Photocathode 12 is configured to enable exposure of at least a part thereof (its active region) to an external EM signal that is to be sensed. This may for example be implemented by placing a photocathode on a substrate, which is optically transparent or has an optical window. The active region of the photocathode may be directly exposed to a light signal or to its reflection from an external reflector, for example another electrode (e.g. anode). The photocathode 12 is appropriately selected (e.g. has certain work function) to be sensitive to light of the desired spectra. In this connection, it should be understood the photocathode and gate configurations are selected such that the wavelength range of the photocathode sensitivity does not overlap with that of the sensitivity of the gate in order to avoid discharge of the gate during the image capture stage, as will be described below.

Generally, electrons flowing in the cavity 22 (electrons emitted from photocathode 12, or from another electron source associated with the electrons; flux generating unit 20) propagate towards the anode 16. The electrons' movement is driven by an electric (and possibly also magnetic) field existing in the cavity 22. Floating gate(s) 14 is/are accommodated in the electrons' path towards the anode and is/are configured to enable electrons' propagation therethrough. To this end, the gate structure is typically in the form of a grid (e.g., a 1D or 2D array) of spaced-apart electrically conductive or non-conductive regions. In some embodiments of the invention, the floating gate elements are comprised of nanoparticles, as will be described more specifically further below. Also non conductive material(s) may be used in the floating gate. The use of a floating gate enables a low-noise procedure for image capture (improved sensitivity, and magnification effect). Image data is stored in the form of charge accumulated on the floating gate which is disconnected from other elements. The charge accumulation stage does not require electrical conductivity of the floating gate. In order to read such charge captured on the floating gate, several to techniques can be used. The conductivity properties of this gate might be required for some reading techniques to achieve a uniform field around the floating gate during the readout step. However, this uniformity is not essential for the operation of the device. If, for example, instead of conductive material (e.g. metal), a non-conductive material (e.g. oxide) is used, then charges will still accumulate there and the image capture mechanism will be implemented, while the field properties will be different, as well as sensitivity to surface states.

In the present example, the sensor cell unit 10 is configured and operable with two sequentially implemented stages of the image acquisition: In the first stage, the so-called "capture" stage, the sensor cell operates to receive incident light (EM signal to be sensed) and store data indicative thereof. This is implemented by exposing photocathode 12 to external EM radiation and storing data indicative of the collected radiation in the form of electric charge accumulated on the floating gate 14.

When photocathode 12 is exposed to incident light, electrons are emitted from the photocathode; with the number of electrons emitted corresponding to the intensity of the incident light. The emitted electrons are driven towards anode 16 by an electric field applied in between the photocathode 12 and the anode 16. This is achievable for example by adjusting a potential difference $V_c$ between the anode 16 and the photocathode 12 (e.g. by the control unit 18). Consequently, the emitted electrons, while moving towards the anode 16, propagate in the vicinity of floating gate 14 and some of them are collected/captured by the floating gate 14, thus accumulating an electric charge thereon.

The amount of the electric charge accumulated on the floating gate 14 depends on several factors including inter alia the duration of the photocathode exposure to the incident light, the intensity of the incident light defining the electrons' flux from the photocathode, the work function of the photocathode and the floating gate materials, as well as the inter-electrode capacitance and the screening factor of the gate. The latter is the ratio between the anode area covered by the gate area and the remaining uncovered anode area onto which the electrons can freely arrive without interacting with the gate. The area ratio between the gate and anode determines the current ratio between the two during the image capture process. For example, if approximately half of the anode area is covered by the gate, then approximately half of the emitted electrons that arrived at the gate plane will reach the gate and half will reach the anode.

The inter-electrode capacitance is mostly dependant on the surface area of electrodes 14 and 16, the space between these electrodes, and dielectric media in said space. To this end, it should be noted that charge accumulated on the floating gate induces a potential difference between the floating gate and the photocathode. In this connection, it should also be understood that appropriate selection of the gate location with respect to the photocathode and anode allows for obtaining a desired inter-electrode capacitance. This is because the cathode-gate-anode arrangement actually defines two capacitors (which can be modeled as being connected in parallel), the capacitance of each of them being determined by the surface areas of the respective electrodes, the distance between them and the media in the space between them. Therefore, adjusting the location of the gate with respect to the cathode and anode provides for varying the sensitivity of the cell to the charge capture on the gate on the one hand, but lowers the dynamic range on the other hand (as less electrons can be captured). Also, the higher the voltage used during the capture the greater the dynamic range.

It should be understood that in order to detect a weak light signal (incident light of low intensity), a low capacitance in between the floating gate 14 and anode 16 might be desirable. This is because with the weak light signal, where only a small number of electrons are emitted from the photocathode and fewer are captured by the floating gate, the low capacitance can provide significant potential difference between the gate and the photocathode. The sensor cell of the present invention may be configured for high sensitivity operation. The gate-anode capacitance can be designed to be from many electrons per volt (e.g. 100 e/V or higher) down to 1 e/V thereby enabling a detection sensitivity of a few photons per sensor cell (e.g. pixel) per exposure (similar to photomultiplier).

The second stage, termed "reading", is performed consecutively after the first, capture stage and is aimed at reading the image data as manifested by the amount of charge accumulated on the floating gate 14. During this stage, the control unit 18 operates to induce emission of electrons to create an electrons' flux to propagate towards anode 16 via the gate 14 so as to detect the charge/potential on the gate in accordance with the current induced on the anode. To this end the control unit operates the electrons' flux generating unit 20, for example an illuminator for actively illuminating the same photocathode 12 or activating another source of charged particles (e.g. another photocathode).

The control unit 18 further operates to control and vary the electric field in the cavity, mainly by varying the cathode-anode potential difference. It should be understood that generally what is to be controlled and varied is the energy of electrons in the flux induced by the flux generating unit 20 (e.g. via emission from the photocathode 12). This can be potential energy controlled via the cathode-anode potential difference as well as kinetic energy (controlled also via a change of frequency of light from illuminator 20). Concurrently, the so-induced electric current on the anode is measured (read). This current is indicative of the amount of charge that was accumulated on the floating gate during the image capture stage.

As was mentioned above, control unit 18 operates to measure the electric current induced on anode 16 while varying the Cathode-Anode voltage. It should be understood that with the charge accumulation on the floating gate during the capture stage, the negative charge of the gate increases, thus causing a screening effect which prevents (or reduces the number of) electrons from passing the gate towards anode 16. Hence, during the reading stage, a measure of the current induced on the anode 16 while applying a voltage (of a fixed value or varying) on the cathode-anode provides an indication of the amount of charge accumulated on the floating gate and thereby indicates the intensity of the incident light captured during the first, capture, stage.

There are several ways to read the accumulated charge. For example, the anode voltage can be increased to detect when the anode current starts to rise, as described above. Another possibly example is to measure the total charge reaching the anode when sweeping the voltage up to Vc which is the anode potential at the capture stage. These examples utilize the electrons' flux intentionally created in the cavity so as to provide electric current on the anode being a function of the charge on the gate.

Alternatively, other charge reading techniques can be used, for example electro-mechanical means which will be more specifically exemplified further below.

It should be understood that after having read the accumulated charge indicative of image data, the charge is to be erased from the floating gate for further image acquisition cycle. Such erasing may be carried out for example by utilizing field-emission (by increasing the electric field in the cavity) or by photo-emission (e.g. using different illumination wavelength such as IR or UV, or thermo-emission of electrons from the gate, as well as tunneling (e.g. photo-assisted). This will be more specifically described further below.

Figure 3A:
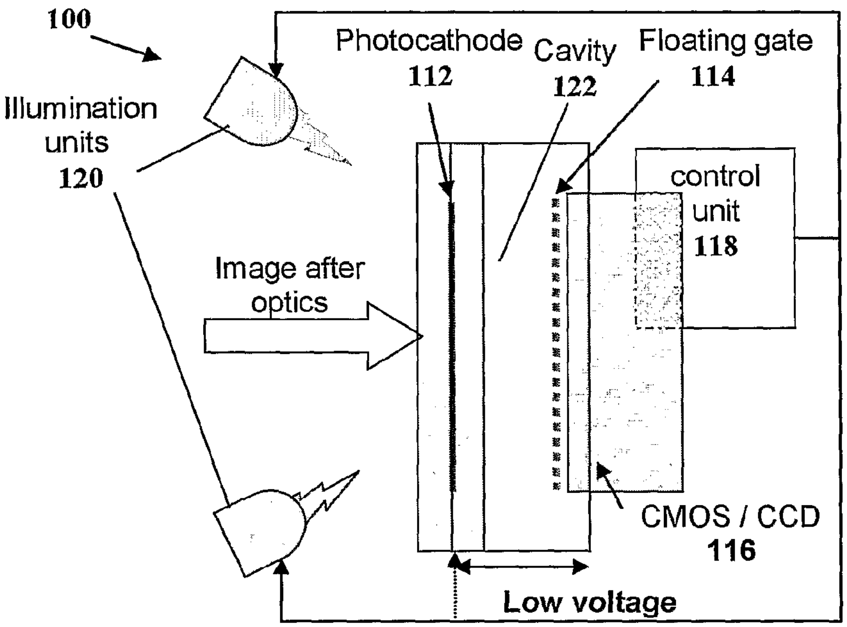
FIGS. 3A and 3B show an example of a specific configuration of the sensor cell of the present invention.
Figure 3B:
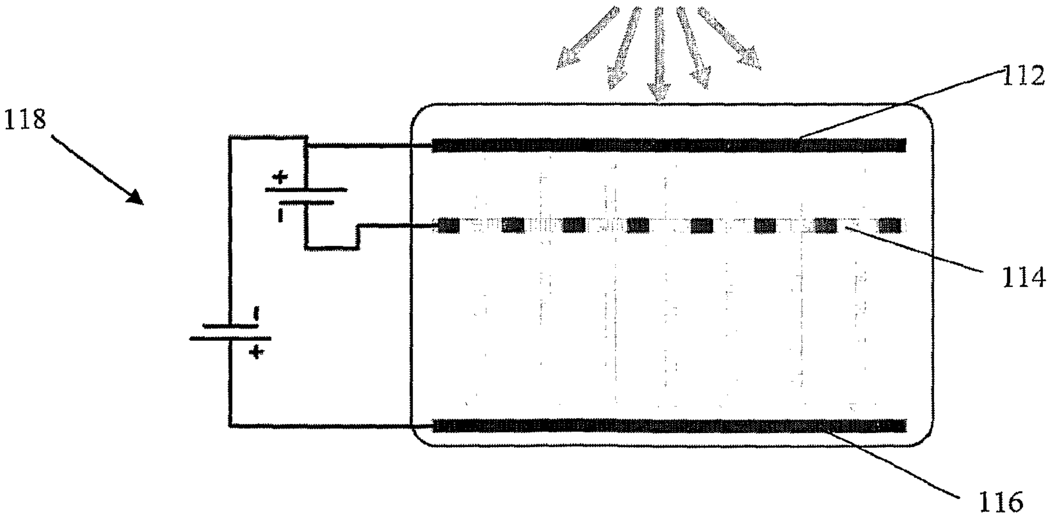

Reference is made to FIGS. 3A and 3B showing an embodiment of a sensor cell 100 of the present invention. In the present example, the sensor cell is integrated with an electronic unit of a standard CMOS image sensor readout. In this case, the accumulated charge is read by sweeping the anode voltage up to Vc (the anode potential at the capture stage) and measuring the total charge reaching the anode.

The sensor cell 100 comprises a photocathode 112, an anode integrated within standard CMOS image sensor readout circuit 116 spaced from the photocathode 112 thus defining a cavity 122 in which a floating gate 114 is located, typically in the vicinity of the anode. The sensor cell is associated with a control unit 118 and an illumination unit 120 (e.g. one or more LEDs or laser diodes) constituting an electrons' flux generating unit adapted for actively extracting electrons from the photocathode 112 by exerting illumination thereon.

The control unit 118, which may be integrated or partially integrated with the standard CMOS image sensor readout circuit, is connected to the anode, to the illumination unit 120 and optionally also to the photocathode 112 and/or the floating gate 114. The control unit 118 is adapted for controlling the electric field profile in the cavity (e.g. by controlling the potential difference between the photocathode 112 and the anode) during the capture and the reading stages and is adapted for measuring the charge induced on the anode (and possibly also on the gate 114). The sensor cell of the present invention (e.g. above described sensor cell 100) is suitable for use in an image sensor comprising an array of sensor cells. Generally, such image sensor and particularly the sensor cells array may be fabricated using a common CMOS fabrication process and accordingly may be adapted to provide standard CMOS image sensor pixel read out (e.g. three transistor/four transistor (3T/4T) pixel read out configuration) connectable to the standard interface of digital imaging devices (e.g. the image sensor output might be connected to common image display subsystem).

Moreover, the sensor cell of the present invention may be used in a night vision image sensor device providing high sensitivity sensor for low intensity light with low energy consumption (low operation voltage). This is achieved by utilizing direct light to electric signal conversion without requiring use of power consuming light to light amplification techniques (image multipliers such as the MCP and Phosphor screen based image intensifiers which typically utilize high operation voltage). Furthermore, in the present example the direct Photocathode-CMOS integration is used to further reduce light-current conversion losses. Moreover, it should be noted that the use of a photocathode and ability to operate with low voltages and the exclusion of MCP increases the life time of the imaging device.

It should be noted that image sensors, particularly night vision devices that utilize high voltage image intensifiers, typically suffer from a dark current (reverse bias leakage) effect which deteriorates the quality of the images obtained by such devices. Dark current generally refers to a relatively small electric current that flows through a photosensitive device, such as a photomultiplier tube, even when no photons are detected by the device. Typically, random electrons are spontaneously emitted (without light stimulation e.g. due to the random generation of electrons and holes within the depletion region of the photosensitive material) from the photosensitive region of such devices and are then swept by the high electric field. MCP based image intensifiers tend to amplify these emitted electrons thereby resulting with relatively high dark current and poor image quality. The technique of the present invention provides for effectively zero dark current at least due to the low operating voltages.

Figure 3C:
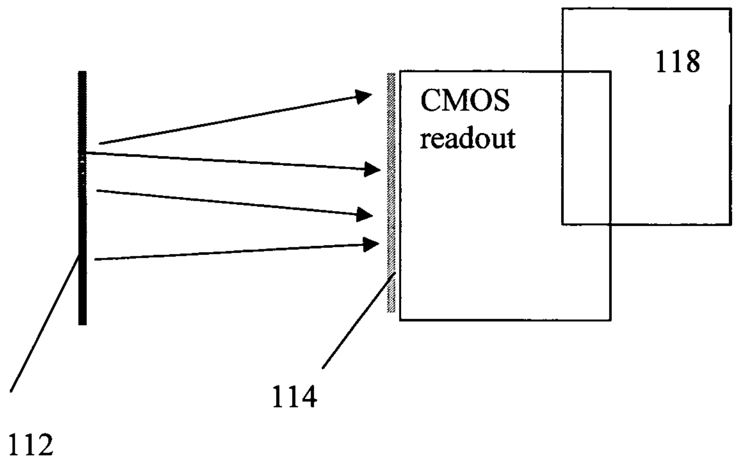
FIG. 3C illustrates one more example of the sensor cell of the present invention.

As indicated above, the present invention, while being compatible with the principles of the CMOS/CCD read out circuits, may be implemented within the CMOS/CCD electronics by adding a photocathode layer and an appropriate control unit. A gate, floating or not, may or may not be used at all; the anode may be constituted by an input electrode of the read our circuit. This is schematically exemplified in FIG. 3C. In this case, the image acquisition process is a single stage process, during which the intensity of light incident on the photocathode is directly converted into an electrical signal measurable by the anode current. The sensitivity of the light detection can be even more improved by using a focusing effect as will be described more specifically further below.

Figure 4A:
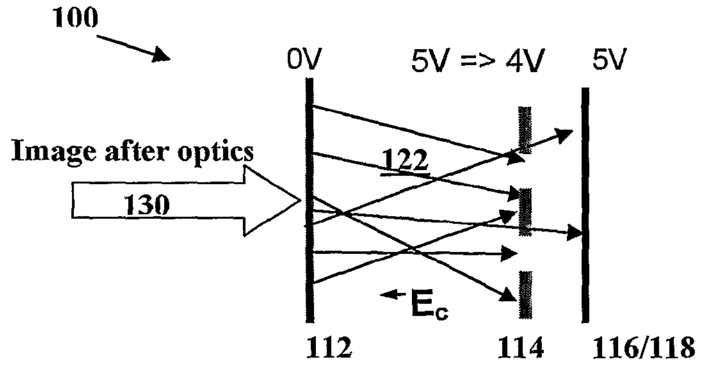
FIGS. 4A and 4B show the principles of an image capture stage of the operation of the sensor cell of the present invention.
Figure 4B:
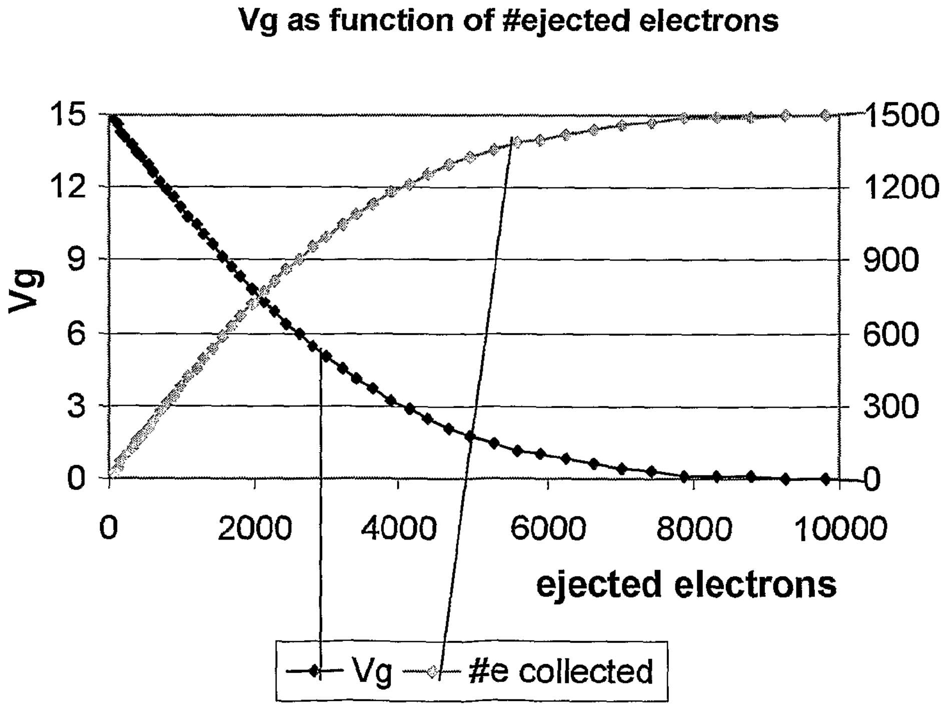
Figure 5A:
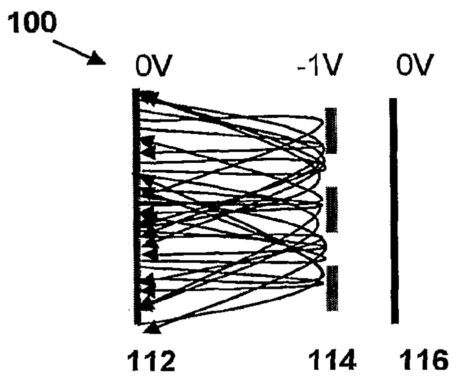
FIGS. 5A to 5C show the principles of the captured image reading stage in the operation of the sensor cell of the present invention.
Figure 5B:
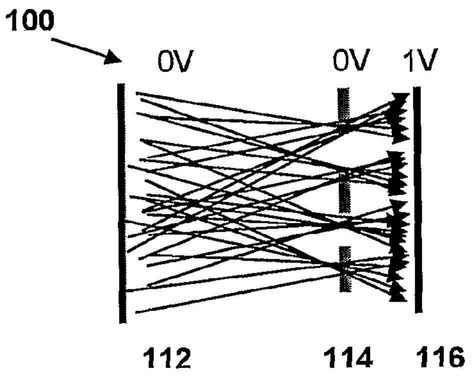
Figure 5C:
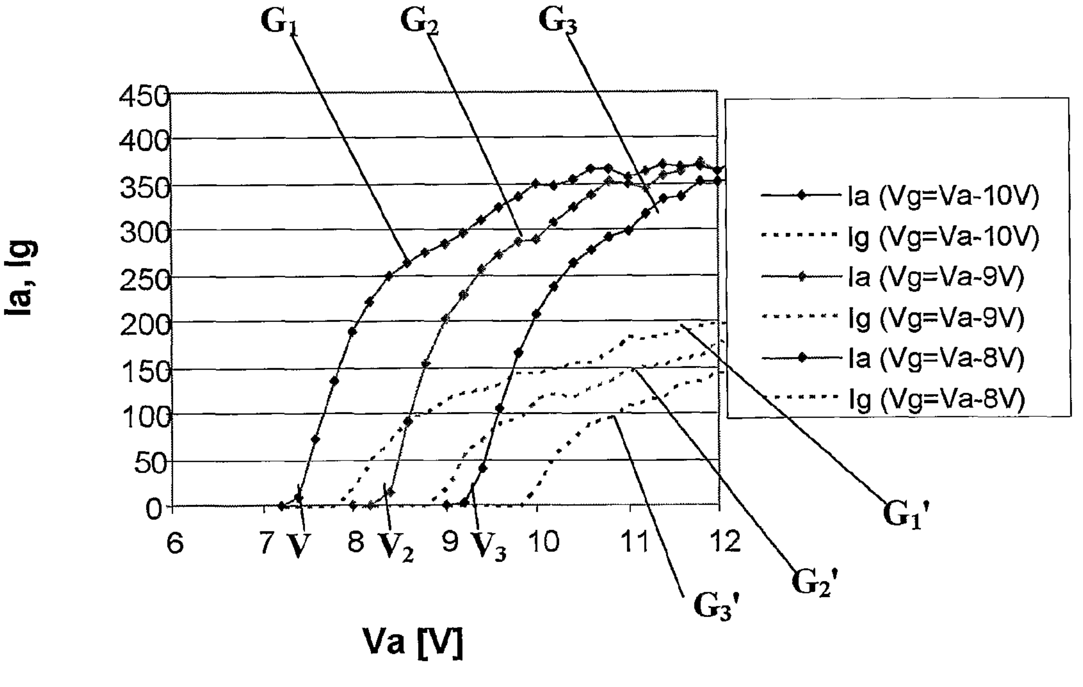

Reference is now made to FIGS. 2 and FIGS. 4A, 4B and 5A-5C describing the operational principles of the sensor cell of the present invention. FIGS. 4A and 4B show the device operation during the capture stage; FIGS. 5A-5C show the device operation during the reading stage.

As shown in FIG. 4A, during the capture stage the photocathode 112 is exposed to incident light signal 130 inducing the emission of electrons therefrom. A certain electric field $E_c$, provided in the cavity 122 between the photocathode and the anode is applied and maintained to direct electrons towards the anode (contained in the control unit 118) thus causing the emitted electrons to propagate through the vicinity of the floating gate 114.

In the present example, required electric field $E_c$ is provided by the control unit 118 by controlling a potential difference between the photocathode 112 and the anode. More specifically, the photocathode is kept at ground potential $V_c=0_V$ and the anode is kept at $V_a=5_V$. The higher this voltage the greater the dynamic range. It should be noted that required electric field $E_c$ for directing the electrons from the photocathode in the direction to the anode might be achieved utilizing other electrode(s) or additional electrode(s), which may further enable spatial adjustment of the electric field/potential within the cavity, for example for providing electrons focusing effect as will be exemplified below with reference to FIG. 6A-6C.

In the present example, the floating gate 114 is located in close proximity to the anode. Therefore, on initiation of the capture stage and the activation of the electric field $E_c$, the electric potential in the vicinity of the floating gate 114 is just slightly below the potential of the anode (i.e. $V_g \leq 5_V$). However during the capture stage, some of the electrons emitted from the photocathode and propagating in the vicinity of the floating gate will always be captured at the gate (due to sufficient energy and appropriate propagation path, as well as for instance the suitable work function of the floating gate acting as a potential well). As a result, a corresponding charge is accumulated on the gate 114. The accumulation of negative charge on the gate gradually lowers its electric potential and subsequently reduces the rate by which electrons are further captured on to the gate (due to screening of the anode potential).

As shown in the non-limiting example of FIGS. 4A and 4B, the potential on the gate, which was initially $V_g \sim 5_V$ slightly below the anode's potential, is reduced during the capture stage to $V_g \sim 4_V$, i.e. 1V below the anode's potential.

It should be understood that in this example the 4V point is used only to illustrate that it corresponds to a certain amount of light. If more light emits electrons during the capture stage, the floating gate voltage can reach lower values, but not lower than the cathode potential (minus the maximal initial kinetic energy of the emitted electrons, and accounting for additional corrections to the potential such as contact potential difference, etc.)

FIG. 4B exemplifies the charge accumulation on the floating gate and the potential of the floating gate as a function of the number of electrons emitted from the photocathode. As shown in the graph, gate voltage $V_g$ is initially at 5V. However, as the amount of electrons ejected from the photocathode increases (dependent on the illumination intensity and duration), the number of electrons accumulated on the floating gate (#e collected) increases as well, and accordingly the gate's potential $V_g$ decreases. Thus, the floating gate is charged in proportion to the intensity of light signal that is to be detected. It should be noted that the number of electrons accumulated on the floating gate, #e collected, and the gate's potential $V_g$ are non-linearly dependent on the amount of electrons emitted/ejected from the photocathode. As shown in the figure, initially the number of accumulated electrons increases rapidly and then gradually reaches a saturation level near about 1500 electrons (dependent on the capacitance of the floating gate). Accordingly, the gate's potential $V_g$, which is rapidly decreasing in the beginning, asymptotically reaches a certain minima. As was mentioned above, as electrons accumulate on the floating gate, the gate's potential $V_g$ decreases thereby reducing the probability for accumulation of additional electrons on the gate; this leads to the non linear effect shown in the graph. This non linear effect might enable a larger dynamic range for the associated imager, possibly rendering its output more similar to that of photographic film. Although with the sensor cell configuration of the invention light of low intensity still provides for a significant change in the gate's potential $V_g$, due to the nonlinearity effect the gate's potential is slow in reaching its saturation level thus enabling intensity differentiation also in high intensity illumination.

For the image reading stage, electrons are actively extracted from the photocathode, e.g. by controllable illumination thereof. Concurrently, the control unit operates to vary the Cathode-Anode voltage in the cavity. As shown in FIGS. 5A and 5B, this is achieved by gradually increasing (sweeping) the anode potential starting from the photocathode potential (e.g. from "0" Volts). As shown, while the anode becomes more positive, at a certain anode potential the emitted electrons become capable of passing the gate potential towards the anode, creating an anode current which is appropriately measured. Thus, the anode voltage is varied at least until the detection of the anode current. The anode current thus corresponds to the accumulated charge on the gate which in turn corresponds to the captured image. It should be noted that generally "sweeping" of the electrons' energy can also be effected by controllably varying the illumination frequency. Generally, the anode current depends on the internal light source intensity, reading time (duration of the reading stage), anode voltage and gate charging level. If a higher gain at readout step is required then a brighter illumination can be used to create a greater electron flux during that step.

FIG. 5C shows simulation of the electric currents induced on the anode and on the floating gate as a function of the anode's potential which is varied during the reading stage. Graphs $G_1$, $G_2$ and $G_3$ correspond to the electric current on the anode at different anode-gate potential difference: $V_g=V_a-8v$, $V_g=V_a-9v$ and $V_g=V_a-10v$ respectively, where $V_a$ is the anode potential. Graphs $G'_1$, $G'_2$ and $G'_3$ correspond to the electric current on the gate as a function of the anode-gate potential difference: $V_g=V_a-8v$, $V_g=V_a-9v$ and $V_g=V_a-10v$.

The different anode-gate potential differences correspond to different values of negative charge accumulated on the floating gate during the capture stage. As shown in the figure, as the gate's voltage is higher relative to the anode (less negative charge is accumulated thereon), the current on the anode is initiated earlier, at a lower potential of the anode. This enables to utilize measurements of the anode's current as a function of the anode's potential to estimate the potential and/or the charge accumulated on the floating gate. The initiation of electric current on the gate occurs at higher anode potentials as compared to the initiation of current on the anode; this is associated with the existence of the negative charge on the gate. This allows for non-destructive reading of the accumulated charge. Keeping in mind that for a "dark pixel" there is no light-related charge accumulated on the gate during the capture stage, a certain initial negative charge should preferably be supplied to the gate (e.g. charge erasing process ends with a certain negative charge on the gate). This enables effective identification of the dark pixels.

For example, the potentials of the anode $V_1$, $V_2$ and $V_3$ at which current on the anode is initiated for different gate's potentials, respectively, might be measured to provide indication of the gate's potential. It should be noted that the gate current starts only at higher Va (i.e. no "image capture" effect during the reading stage). Alternatively, the total charge reaching the anode can be measured when sweeping the anode voltage from 0 to Vc (Vc is the voltage on anode in the capture stage). The higher the integral of the current on the anode, the "darker" the pixel was.

Figure 5D:
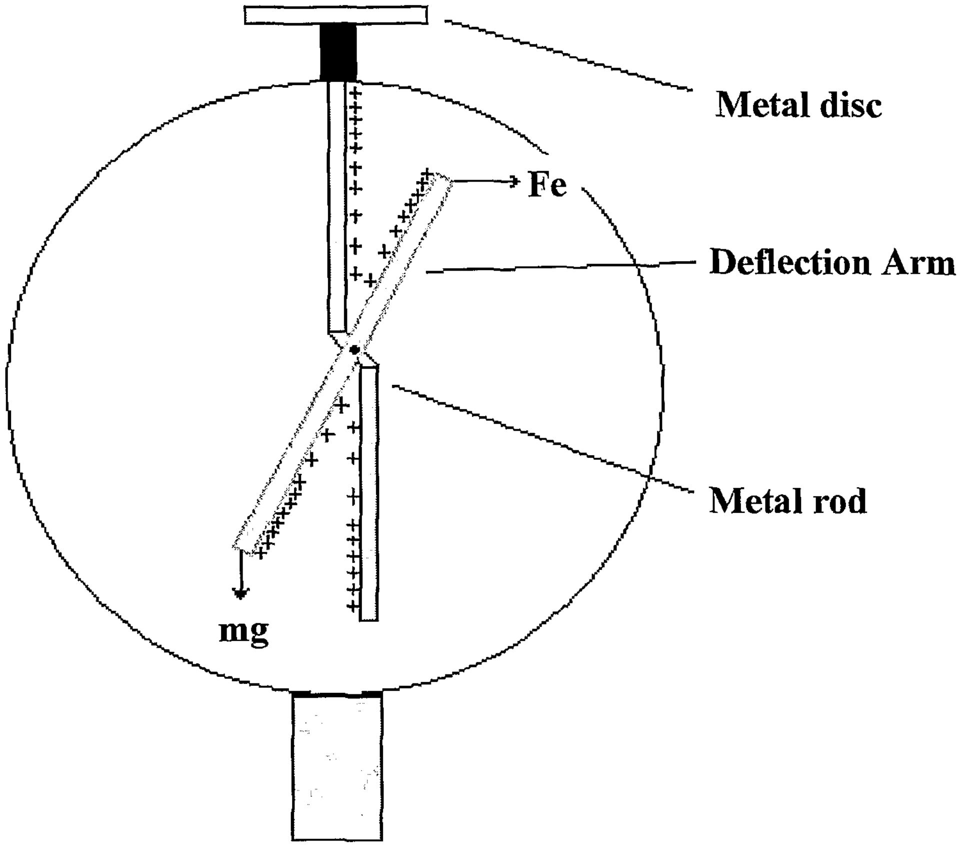
FIG. 5D exemplifies an electro-mechanical assembly suitable to be used for reading charge accumulated on a floating gate.

It should further be noted that the above-exemplified configuration, in which a floating gate is used for the charge accumulation thereon, can utilize another reading scheme. This may for example be implemented using an appropriate electro-mechanical assembly. An example of such assembly is shown schematically in FIG. 5D. Here, a metal rod is used, which is brought close to the gate and is controllably charged; placed between the metal rod and the gate is a displaceable element or a deflection arm. The latter is displaced towards or away from the gate depending on the charge thereon against the controllable (known) charge on the metal rod. The displacement may be detected by using reflection of light from the deflection arm: a change (shift) in the path of light reflected from the deflection arm (or a change in the detected reflection pattern, as the case may be) is indicative of a change in the deflection arm position caused by a charge on the floating gate as compared to the known charge on the metal rod (similar to the operation of DLP chip).

Figure 6B:
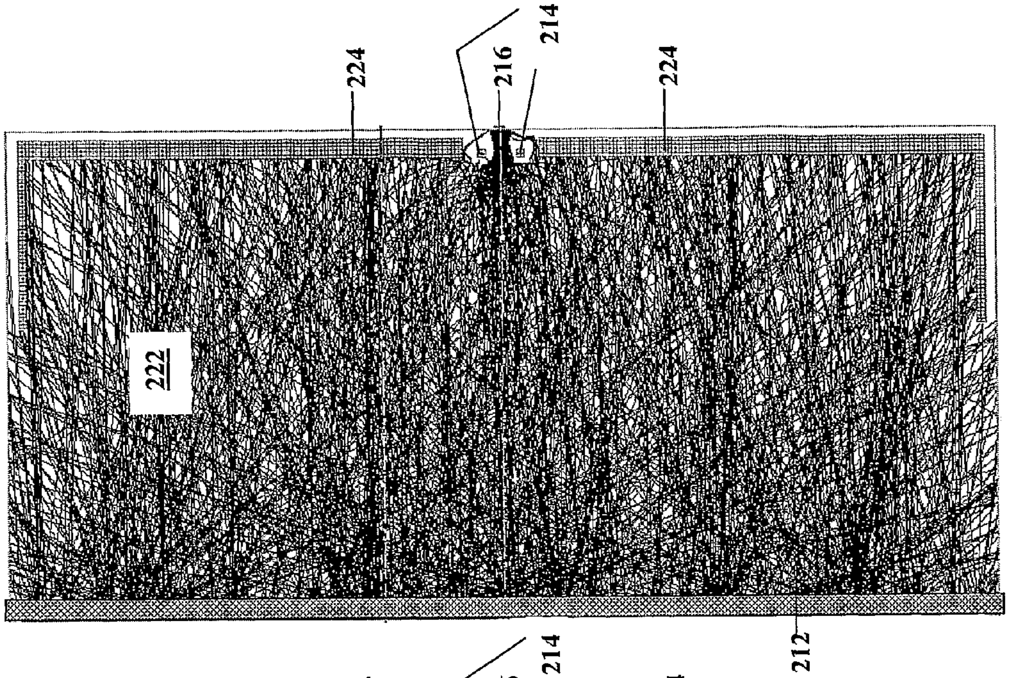
FIGS. 6A to 6C exemplify how the sensitivity of the sensor cell can be increased using a focusing effect.
Figure 6A:
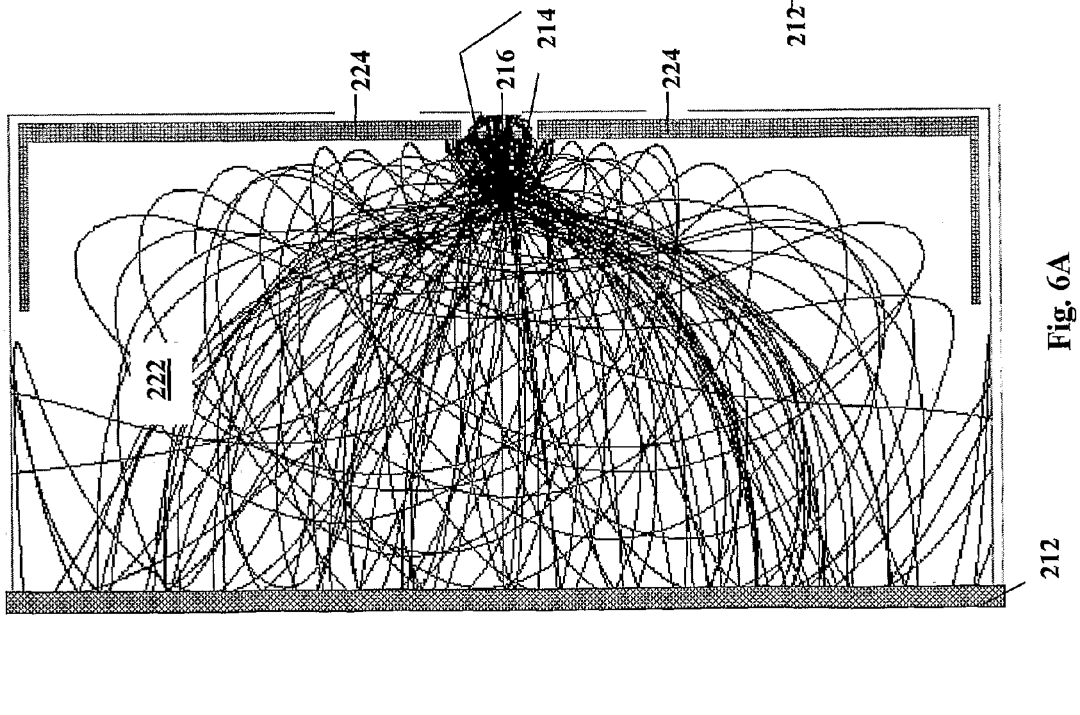
Figure 6C:
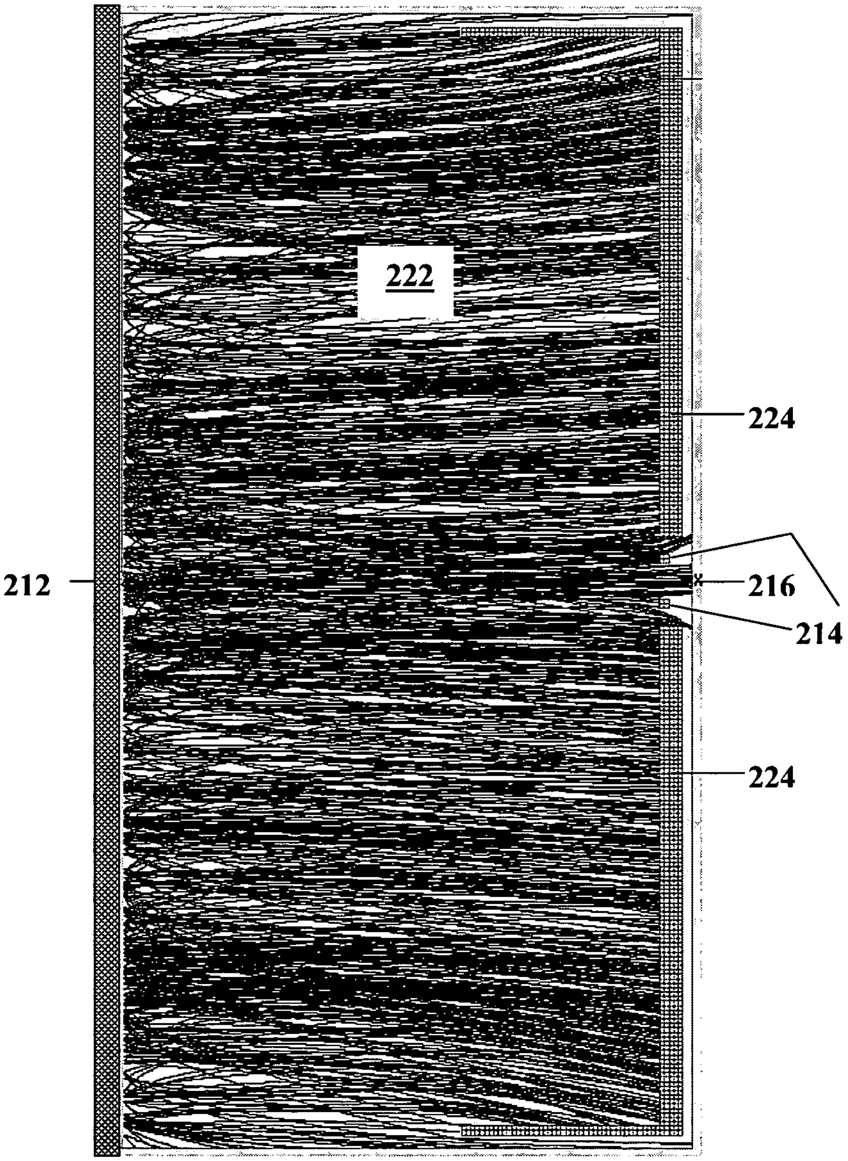

As indicated above, the desired electric field or electric field profile in the cavity may be created using additional electrode(s). An example of this approach is shown in FIGS. 6A-6C. A sensor cell is shown in which a cavity 222 is defined by an electrodes' assembly including a photocathode 212, a floating gate 214, an anode 216, and a focusing electrode 224. Here, gate 214 and anode 216 are relatively small as compared to photocathode 212 and are located within an aperture made in focusing electrode 224. The latter practically surrounds the space between the photocathode and the anode. Thus, an appropriate negative (relatively) potential on the focusing electrode 224 causes electrons emitted from the photocathode 212 to propagate towards the point-like anode 216 thereby resulting in the charge accumulation on the floating gate 214. This configuration increases the sensitivity of the cell, because even a few emitted electrons per the unit surface of the photocathode can cause the detectable accumulation of charge on the gate.

Also, the use of a focusing electrode enables to mediate between a large photosensitive pixel size (for collecting relatively large amount of light) and a small "active" sensor area—to keep the gate—anode capacitance as small as possible. The figure shows feasible proportions, when the pixel is about 10 microns in aperture, and the active area is in a sub micron range.

The focusing effect within the sensor cell can be controllably adjustable in accordance with the intensity of input light signal and can act as an electronic shutter. Such adjustment is performed by controlling a potential on the focusing electrode: the more positive the potential the lower the focusing effect. FIG. 6A shows a relatively high focusing; FIG. 6B illustrates how the so-accumulated charge on the gate affects further electrons' propagation towards the anode: as the charge accumulated on the gate increases the negative potential of the gate, the focusing effect is reduced, thus enabling self-adaptive focusing. FIG. 6C shows another situation where a relatively positive potential is deliberately put on the focusing electrode during the capture phase, in order to reduce the device's sensitivity, and thus facilitating with the device operation when dealing with a high light intensity image. This relatively positive potential on the focusing electrode (as compared to the other electrodes of the cavity) results in defocusing in order to handle picture taken in high light intensity conditions.

As described above, the gate is an electrode configured to enable electrons' passage therethrough and is preferably located close to the anode. This can be achieved by making the gate in the form of a grid. The inventors have found that the sensitivity of the sensor cell can be even more increased by configuring the gate as a layer of nanoparticles, metal or semiconductor, thus reducing the capacitance of the gate-anode structure. Practically, this configuration can be implemented by coupling the nanoparticles to the anode using linking molecules. The particles may be nano-spheres (ball-like) of about 2-100 nm diameter. The use of nanoparticles enables to obtain the capacitance down to 1 e/V per particle, thus 1 e on each particle changes the gate layer's potential by 1V.

Figure 7A:
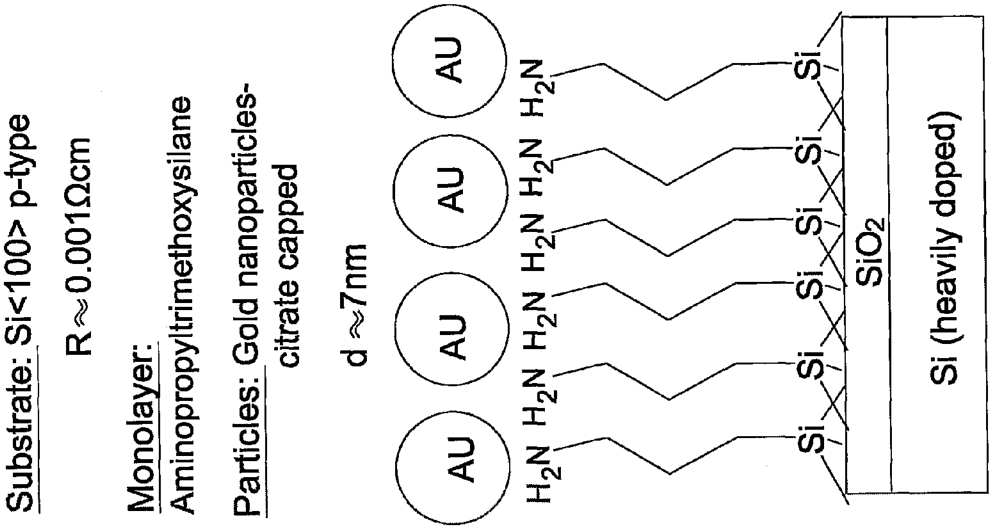
FIGS. 7A and 7B exemplify the confirmation of the floating gate suitable to be used in the sensor cell of the present invention.
Figure 7B:
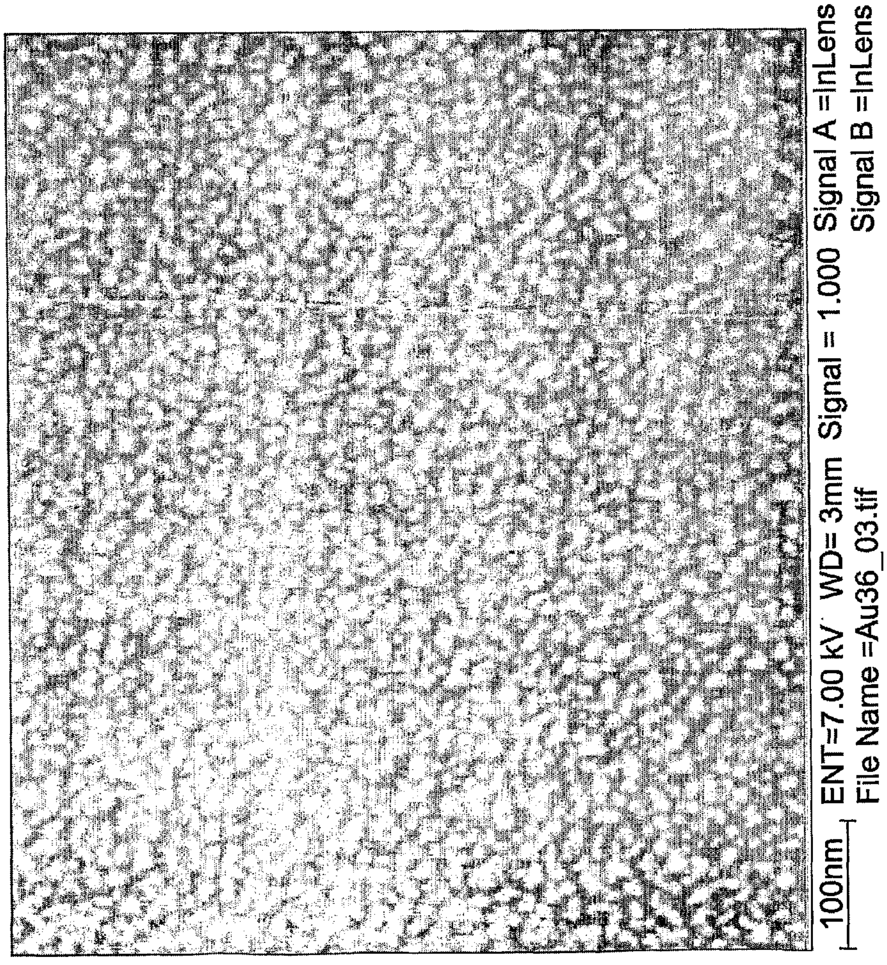

An example of such configuration is shown in FIGS. 7A and 7B. FIG. 7A shows an anode structure formed by a $SiO_2$ layer on a heavily doped p-type Si substrate. Linking molecules, $H_2N$ in the present example, couple 7 nm diameter gold nanoparticles to Si of the anode structure. FIG. 7B shows the so-obtained gate-anode structure.

Figure 8:
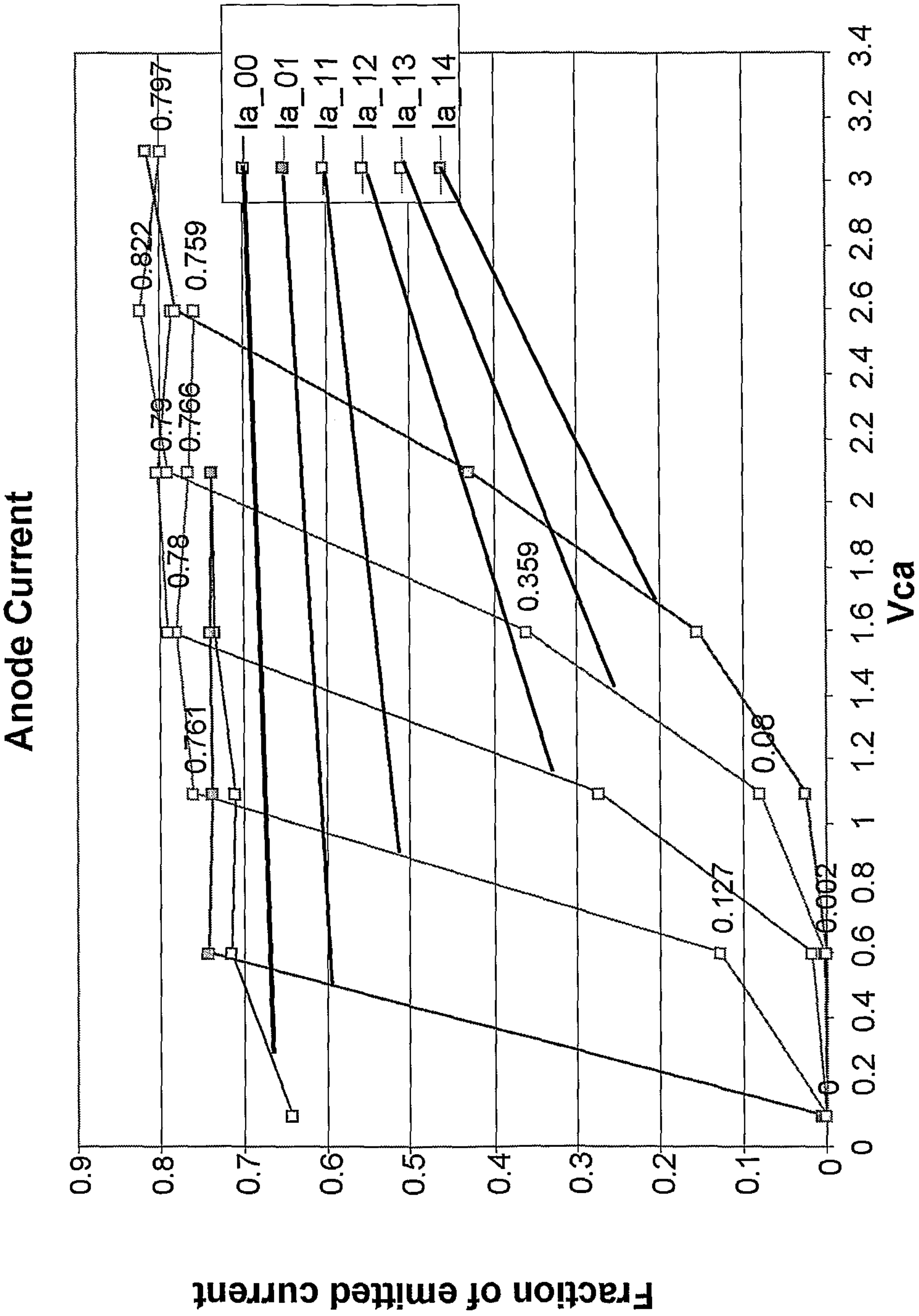
FIG. 8 illustrates the effect of a floating gate configuration, such as the one in FIGS. 7A-7B, but with two different sizes of floating gate particles, on the sensitivity of the sensor cell.

The particles' size affects the anode current. FIG. 8 illustrates the effect of having nano-particles of different sizes (in this example, two different sizes) within the floating gate structure. Each graph corresponds to the anode current as a function of cathode-anode potential difference for the configuration where the floating gate is formed by a plurality of nano-particles including the particles of two sizes. Each graph corresponds to a different combination of charge accumulated on the particles. In the figure, the digits in the indices "00", "01", "11", "12", "13" and "14", each correspond to the number of electrons accumulated on each particle in each size-group. For example, "01" indicates no electrons on the smaller particles, and one electron on each larger size particle. The smaller particles (smaller capacitance) generate a larger potential difference due to the capture of a single electron, but can therefore capture few electrons. The larger particles (larger by one or more orders of magnitude) need to capture more electrons to create a significant negative potential, but as a result they can contain a larger number of electrons. The result of combining the two, in a desirable way, on the floating gate surface is that more states of charging can be detected, and a greater range of sensitivity can be achieved (from very few electrons, corresponding to low intensity, to a relatively large number, corresponding to high intensity).

Thus, the present invention provides a novel simple and effective approach for image sensing suitable for a wide range of imaging. The invention can be easily integrated with the existing technologies, taking advantages of the commonly used electronic read out circuits.

The invention claimed is:

1. An image sensor cell comprising:

an electrodes' assembly configured and operable to receive an input light signal and produce a corresponding electrical signal, the electrodes' assembly comprising: a photocathode having an active region capable of emitting electrons in response to incident light; at least one floating electrode in a path of electrons emitted from the photocathode; and at least one anode spaced apart from said at least one floating electrode and serving for measuring therein an electric current corresponding to the charge accumulated on the float electrode; and a control unit configured and operable for controlling an electric field profile in said path so as to selectively cause the electrons' capture on said at least one floating electrode resulting in accumulation of charge on said at least one floating electrode corresponding to the input electromagnetic signal indicative of an acquired image, thereby enabling direct reading of the accumulated charge;

the image sensor cell thereby providing for direct conversion of a light signal into an electric signal indicative thereof.

2. The image sensor cell of claim 1, wherein the control unit is configured and operable to cause creation of an electrons' flux in said path towards the anode and to modify the electric field profile allowing the electrons' flux passing through the charged gate resulting in an electric current on the anode indicative of said accumulated charge.

3. The image sensor cell of claim 2, comprising an electrons' flux generating unit for generating said electron's flux in said path.

4. The image sensor cell of claim 3, wherein said electron's flux generating unit is configured and operable to create the electrons' flux by field-, photo- or thermo-emission effect.

5. The image sensor cell of claim 4, wherein said electron's flux generating unit comprises an illuminator for illuminating said photocathode.

6. The image sensor cell of claim 1, wherein the electrodes' assembly is sequentially operable in first and second modes for respectively acquiring an image data in the form of the accumulated charge and reading said charge, said first and second modes differing from one another in the electric field profile in said path.

7. The image sensor cell of claim 6, wherein the control unit is configured and operable to effect the first mode by providing the electric field of a certain value in said path, and to effect the second mode by providing a varying electric field in said path.

8. The image sensor cell of claim 6, wherein the electrodes' assembly is operable in an image erasing mode during which said floating electrode is at least partially discharged.

9. The image sensor cell of claim 6, wherein the electrodes' assembly is operable in an image erasing mode during which said floating electrode is discharged to a certain value to enable dark pixel identification.

10. The image sensor cell of claim 1, wherein the floating gate is a grid formed by an array of spaced-apart electrically conductive elements.

11. The image sensor cell of claim 10, wherein said grid comprises a layer containing a plurality of particles.

12. The image sensor cell of claim 11, wherein said particles are linked to a surface of the anode.

13. The image sensor cell of claim 11, wherein said particles include particles of different sizes.

14. An image sensor cell of claim 1 wherein at least one electrode of the electrodes' assembly is a part of a Complementary metal-oxide-semiconductor (CMOS) integrated circuit.

15. The image sensor cell of claim 14, wherein the control unit is at least partially integrated in said circuit.

16. An image sensor cell of claim 1 wherein at least one electrode of the electrodes' assembly is a part of a Charge-Coupled Device (CCD).

17. The image sensor cell of claim 16, wherein the control unit is at least partially integrated in said CCD.

18. An imaging device comprising a matrix of sensor cells defining a matrix of image pixels, each of the sensor cells being configured according to claim 1.

19. An image sensor cell comprising:

an electrodes' assembly configured and operable to receive an input light signal and produce a corresponding electrical signal, the electrodes' assembly comprising: a photocathode having an active region capable of emitting electrons in response to incident light, at least one floating electrode in a path of electrons emitted from the photocathode, and at least one anode electrode spaced apart from said floating electrode and serving for measuring therein an electric current corresponding to the charge accumulated on the floating electrode, the electrodes' assembly enabling control of an electric field profile in said path to thereby allow for selectively causing the electrons' capture on said at least one floating electrode resulting in accumulation of charge on said at least one floating electrode corresponding to the input light indicative of an acquired image, thereby enabling direct reading of the accumulated charge; the image sensor cell thereby providing for direct conversion of a light signal into an electric signal indicative thereof; and a control unit configured and operable for performing said control of the electric field profile in said path.

20. An image sensor cell of claim 19, wherein at least one electrode of the electrodes' assembly is a part of an electronic circuit, said electronic circuit being either a Complementary metal-oxide-semiconductor (CMOS) integrated circuit, or a Charge-Coupled Device (CCD).

21. An image sensor cell of claim 19, wherein at least one electrode of the electrodes' assembly is a part of an electronic circuit, said electronic circuit being either a Complementary metal-oxide-semiconductor (CMOS) integrated circuit, or a Charge-Coupled Device (CCD), the control unit being at least partially integrated in said electronic circuit.

* * * * *